United States Patent
Mizuno et al.

(10) Patent No.: US 7,336,808 B2
(45) Date of Patent: Feb. 26, 2008

(54) OPTICAL SENSOR

(75) Inventors: Seiichiro Mizuno, Hamamatsu (JP);
Tatsumi Yamanaka, Hamamatsu (JP);
Yoshimaro Fujii, Hamamatsu (JP)

(73) Assignee: Hamamatsu Photonics K.K., Shizuoka (JP)

(*) Notice: Subject to any disclaimer, the term of this patent is extended or adjusted under 35 U.S.C. 154(b) by 395 days.

(21) Appl. No.: 10/504,267

(22) PCT Filed: Feb. 12, 2003

(86) PCT No.: PCT/JP03/01444

§ 371 (c)(1),
(2), (4) Date: Apr. 21, 2005

(87) PCT Pub. No.: WO03/069288

PCT Pub. Date: Aug. 21, 2003

(65) Prior Publication Data

US 2006/0165294 A1    Jul. 27, 2006

(30) Foreign Application Priority Data

Feb. 12, 2002    (JP)    ............................. 2002-034298

(51) Int. Cl.
*G06K 9/00* (2006.01)
(52) U.S. Cl. .................................... 382/124
(58) Field of Classification Search ........ 382/115–127; 340/5.53, 5.83; 283/68
See application file for complete search history.

(56) References Cited

U.S. PATENT DOCUMENTS

| 4,843,520 | A |   | 6/1989 | Nakatani et al. |
|-----------|---|---|--------|-----------------|
| 5,189,500 | A |   | 2/1993 | Kusunoki |
| 5,665,959 | A | * | 9/1997 | Fossum et al. .......... 250/208.1 |
| 6,476,374 | B1 |  | 11/2002 | Kozlowski et al. |
| 6,504,140 | B1 | * | 1/2003 | Ueno et al. ............. 250/214 R |
| 6,552,745 | B1 | * | 4/2003 | Perner ........................ 348/308 |
| 2001/0005059 | A1 | | 6/2001 | Koyanagi et al. |

FOREIGN PATENT DOCUMENTS

JP    63-190364    8/1988

(Continued)

OTHER PUBLICATIONS

Kurino et al., "Intelligent Image Sensor Chip with Three Dimensional Structure"; Electronic Devices Meeting Dec. 5-8, 1999; IEDM Technical Digest 1999, p. 879-882.

*Primary Examiner*—Vikkram Bali
(74) *Attorney, Agent, or Firm*—Drinker Biddle & Reath LLP

(57) ABSTRACT

Photodetector 1 is equipped with photodiodes PDn, integrating circuits 10*n*, CDS circuits 20*n*, and hold circuits 30*n*. Each integrating circuit 10*n* includes an amplifier 11*n*, a capacitor C, and a switch SW. Photodiodes PDn are aligned on a first substrate 100. A differential pair input part (transistors $T_1$ and $T_2$) of amplifier 11*n*, capacitor C, etc., of each integrating circuit 10*n* are disposed on a second substrate 200. A drive part (transistors $T_5$ and $T_6$) of amplifier 11*n*, etc., of each integrating circuit 10*n* are disposed on a third substrate 300.

3 Claims, 6 Drawing Sheets

FOREIGN PATENT DOCUMENTS

| | | |
|---|---|---|
| JP | 63-298187 | 12/1988 |
| JP | 1-239915 | 9/1989 |
| JP | 2-271281 | 11/1990 |
| JP | 5-13786 | 1/1993 |
| JP | 6-29507 | 2/1994 |
| JP | 6-40824 | 5/1994 |
| JP | 63-205527 | 8/1998 |
| JP | 11-287863 | 10/1999 |
| JP | 2001-291877 | 10/2001 |
| JP | 2001-339057 | 12/2001 |
| JP | 2002-354195 | 12/2002 |
| WO | WO 02/27798 A2 | 4/2002 |

\* cited by examiner

OPTICAL SENSOR

FIELD OF THE ART

This invention concerns a photodetector wherein a plurality of photodiodes are aligned.

BACKGROUND ART

A photodetector is equipped with a plurality of photodiodes, which are aligned one-dimensionally or two-dimensionally, and integrating circuits, which include amplifiers and capacitors, and may be equipped in some cases with a signal processing circuit at a more downstream position. With this photodetector, charges of amounts, which are in accordance with the intensities of incident light on the respective photodiodes, are output from the photodiodes, these charges are accumulated in the capacitors, and voltages, which are in accordance with the amounts of these accumulated charges, are output from the integrating circuits. Based on the voltages output from the integrating circuits in accordance with the amounts of charges generated respectively at the plurality of photodiodes, the light, made incident on a light receiving part wherein the plurality of photodiodes are aligned, is detected.

As such a photodetector, the arrangement disclosed in Japanese Published Unexamined Patent Application No. Hei 11-287863 is known. With the photodetector disclosed in this publication, a first substrate, wherein a plurality of photodiodes are aligned two-dimensionally, and a second substrate, wherein integrating circuits, etc., are disposed, are connected to each other by a flexible cable. Also, a switch array is disposed on the first substrate on which the plurality of photodiode arrays are aligned, and by the on/off of the respective switches in this switch array, one or more of the photodiodes of the two-dimensionally aligned plurality of photodiodes are selected and connected to the integrating circuits.

DISCLOSURE OF THE INVENTION

However, with the photodetector disclosed in the above-mentioned publication, wiring, which connect the respective photodiodes and the respective switches to each other, exist in a region between the plurality of photodiodes aligned on the first substrate, and the number of such wiring is extremely large. If the first substrate is to be increased in the number of photodiodes (number of pixels) or made high in density, even more wiring will be required in a narrow region. Increasing of the number of pixels and the realization of high density are thus difficult. Also, since the wiring become long, noise becomes superposed readily on the charges that are sent from the photodiodes to the integrating circuits, thus disabling accurate photodetection.

In order to resolve such a problem, bump-connecting the first substrate, in which the plurality of photodiodes are aligned two-dimensionally, and the second substrate, in which the integrating circuits, etc., are disposed, to each other may be considered. By bump connection, the number of wiring on the first substrate can be reduced or the wiring can be made short, thus enabling the first substrate to be increased in the number of pixels and made high in density.

However, in the case of bump connection, the photodiodes on the first substrate and the amplifiers, included in the integrating circuits on the second substrate, will be positioned close to each other. The temperature of the photodiodes on the first substrate will thus rise due to heat generation by the amplifiers on the second substrate, and due to this temperature rise, accurate photodetection will be disabled.

This invention has been made to resolve the above problems, and an object thereof is to provide a photodetector, enabling increase of the number of pixels and realization of high density and yet enabling accurate photodetection.

This invention's photodetector comprises: (1) a plurality of photodiodes, each generating charges of an amount that is in accordance with the intensity of incident light; and (2) integrating circuits, each including an amplifier, having a differential pair input part at the input end side and a drive part at the output end side, and a capacitor and a switch, which are disposed between the input end and the output end of the amplifier, and, when the switch is opened, accumulating, in the capacitor, charges input into the input end from a photodiode and outputting, from the output end, a voltage that is in accordance with the amount of charges accumulated in the capacitor.

This invention's photodetector is also characterized in that the plurality of photodiodes are disposed on a first substrate, the capacitors and the differential pair input parts are disposed on a second substrate, the drive parts are disposed on a third substrate, and the photodiodes and the input ends of the integrating circuits are electrically connected to each other by the first substrate and second substrate being bump-connected to each other. It is furthermore preferable for the second substrate and third substrate to be bump-connected to each other.

Or this invention's photodetector is characterized in that the plurality of photodiodes are disposed on a first substrate, the capacitors, the differential pair input parts, and the drive parts are disposed on a second substrate, the photodiodes and the input ends of the integrating circuits are electrically connected to each other by the first substrate and second substrate being bump-connected to each other, the capacitors and differential pair input parts are disposed in a first region on the second substrate that overlaps with a region on the first substrate in which the plurality of photodiodes are disposed, and the drive parts are disposed in a second region on the second substrate that does not overlap with the region on the first substrate in which the plurality of photodiodes are disposed.

With this invention, when light is made incident on the first substrate, charges of amounts, which are in accordance with the incident intensities, are generated from the respective photodiodes of the first substrate. These charges are input into the integrating circuits on the second substrate (or in the first region of the second substrate), which is bump-connected to the first substrate, and accumulated in the capacitors. Voltages, which are in accordance with the amounts of charges accumulated in the capacitors, are then output from the drive parts of the integrating circuits on the third substrate (or in the second region of the second substrate).

With this invention, the differential pair input parts of the amplifiers and the capacitors of the integrating circuits are disposed on the second substrate (or in the first region of the second substrate), which is bump-connected to the first substrate. Meanwhile, the drive parts of the amplifiers of the integrating circuits are disposed on a third substrate (or in the second region of the second substrate), which is not bump-connected to the first substrate. The photodetector of this invention thus enables the number of pixels to be increased and a high density to be realized and yet enables accurate photodetection.

BEST MODES FOR CARRYING OUT THE INVENTION

Embodiments of this invention shall now be described in detail with reference to the drawings. In the description of the drawings, the same elements shall be provided with the same symbols and redundant description shall be omitted.

Figure 1:
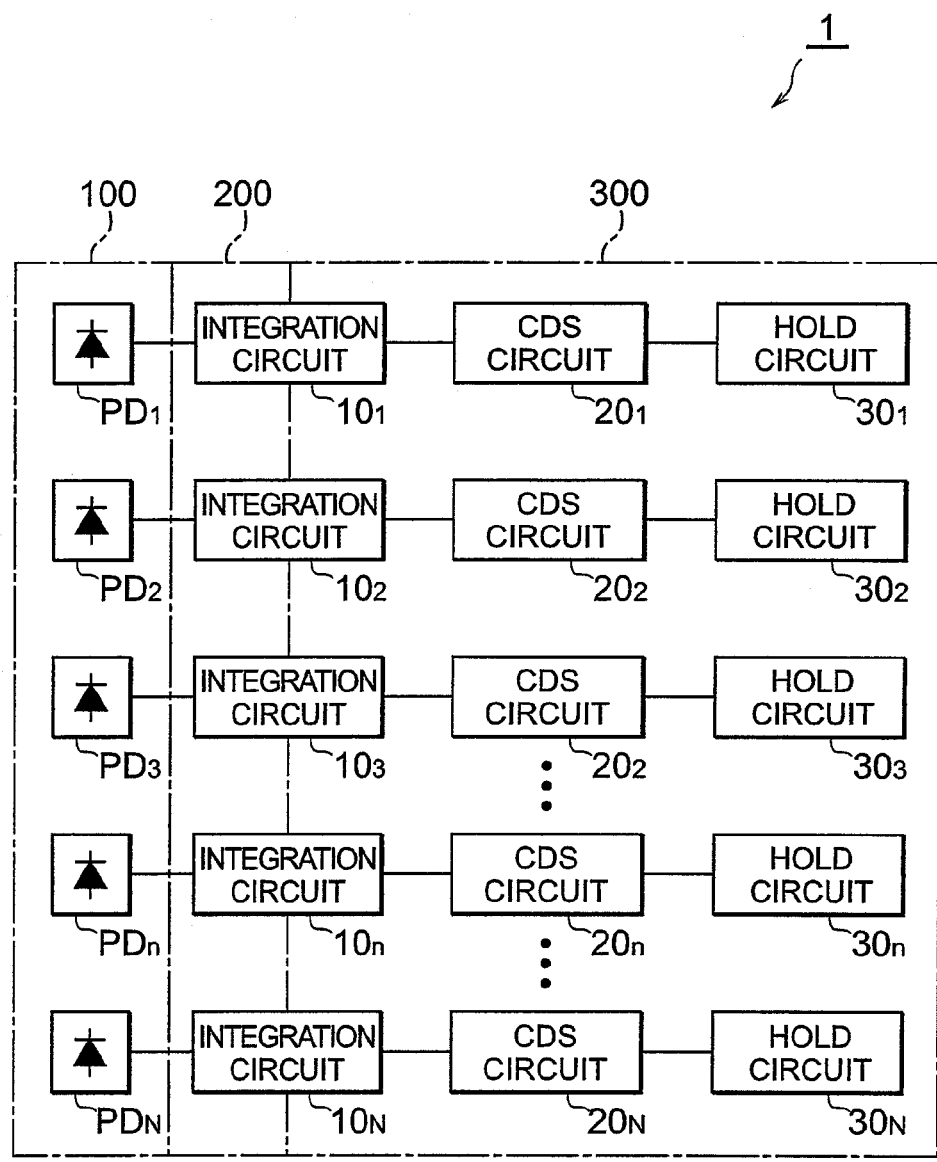
FIG. 1 is a schematic view of a photodetector 1 of an embodiment.

FIG. 1 is a schematic view of a photodetector 1 of an embodiment. This photodetector 1 is equipped with N photodiodes $PD_1$ to $PD_N$, N integrating circuits $10_1$ to $10_N$, N CDS (Correlated Double Sampling) circuits $20_1$, to $20_N$, and N hold circuits $30_1$, to $30_N$. Here, N is an integer of no less than 2.

Each photodiode $PD_n$, generates charges of an amount that is in accordance with the intensity of incident light. Here, n is an integer no less than 1 and no more than N. Each integrating circuit $10_n$ inputs the charges generated by photodiode $PD_n$, accumulates these charges in a capacitor, and outputs a voltage that is in accordance with the amount of accumulated charges. Each CDS circuit $20_n$ inputs the voltage output from integrating circuit $10_n$ and outputs a voltage expressing the variation amount of the input voltage within a fixed time. Each hold circuit $30_n$, inputs the voltage output from CDS circuit $20_n$, holds this voltage for a fixed period and outputs this voltage.

Figure 2:
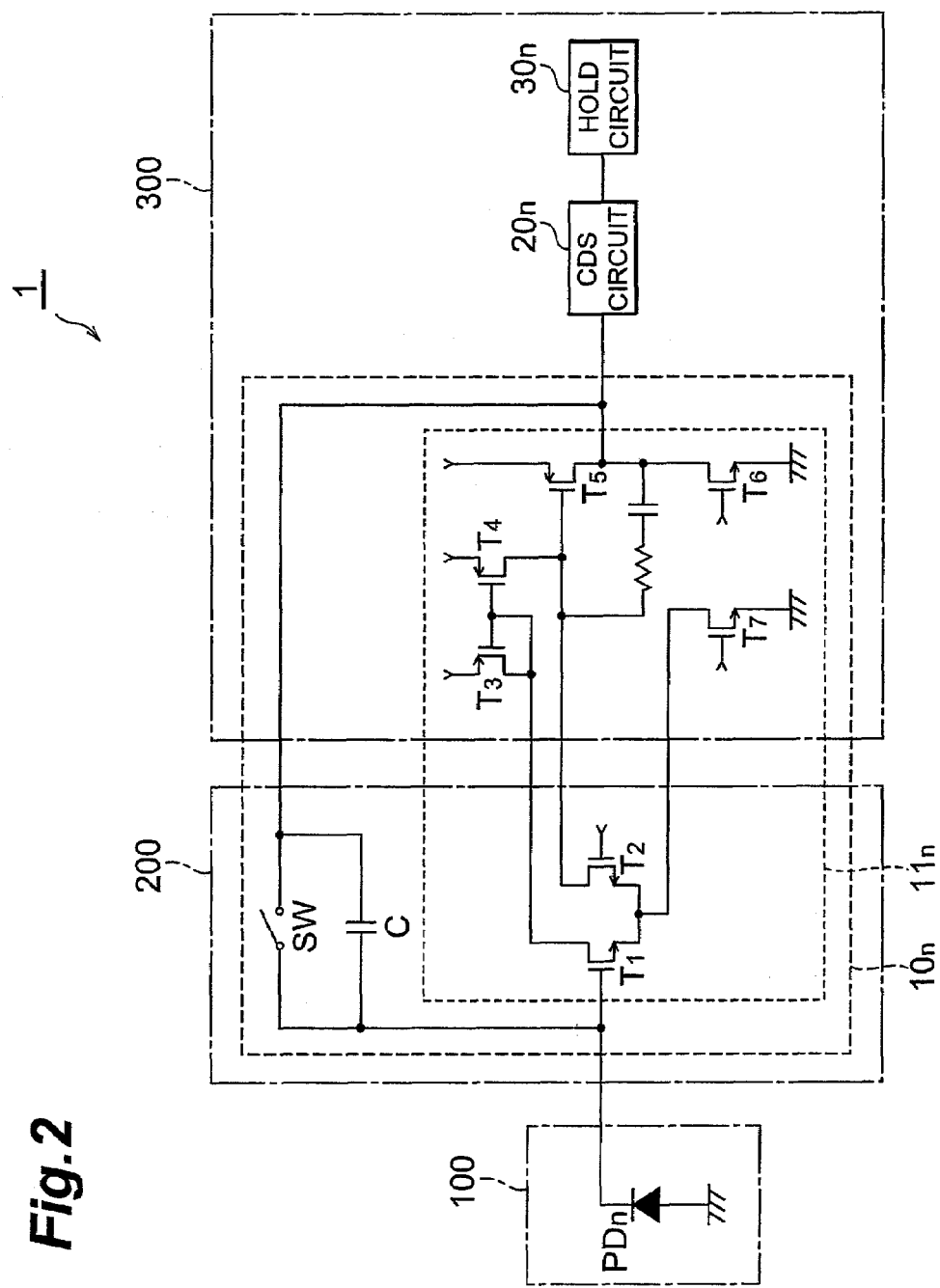
FIG. 2 is a detailed circuit diagram of integration or integrating circuit $10n$ of photodetector 1 of the embodiment.

FIG. 2 is a detailed circuit diagram of an integrating circuit $10_n$ of photodetector 1 of the present embodiment. With each photodiode $PD_n$, an anode terminal is grounded and a cathode terminal is connected to an input end of an amplifier $11_n$ of integrating circuit $10_n$. Integrating circuit $10_n$ includes amplifier $11_n$, a capacitor C, and a switch SW. Capacitor C and switch SW are mutually connected in parallel and are disposed between the input end and output end of amplifier $11_n$. A CDS circuit $20_n$, is connected to the output end of amplifier $11_n$. With this integrating circuit $10_n$, with the closing of switch SW, capacitor C is discharged and the output voltage is initialized. Meanwhile, during the period in which switch SW is open, the charges input into the input end from photodiode $PD_n$ are accumulated in capacitor C and a voltage, which is in accordance with the amount of charges accumulated in this capacitor C, is output from the output end.

Amplifier $11_n$ has FET type transistors $T_1$ to $T_7$. Of these, transistors $T_1$, $T_2$, $T_6$, and $T_7$ are NMOS transistors, and transistors $T_3$, $T_4$, and $T_5$ are PMOS transistors. The gate terminal of transistor $T_1$ is connected to the input end of amplifier $11_n$. The source terminal of transistor $T_1$ and the source terminal of transistor $T_2$ are respectively connected to the drain terminal of transistor $T_7$. The source terminal of transistor $T_7$ is grounded. The drain terminal of transistor $T_1$ is connected to the gate terminal and the drain terminal of transistor $T_3$ and the gate terminal of transistor $T_4$. The drain terminal of transistor $T_2$ is connected to the drain terminal of transistor $T_4$ and the gate terminal of transistor $T_5$. The drain terminal of transistor $T_5$ is connected to the drain terminal of transistor $T_6$ and to the output end of amplifier $11_n$. The source terminal of transistor $T_6$ is grounded. A predetermined voltage is input into the source terminal of each of transistors $T_3$ to $T_5$. A predetermined DC voltage is input into the gate terminal of each of transistors $T_2$, $T_6$, and $T_7$. In order to prevent oscillation as an amplifier, a capacitor and a resistor element are connected in series between the drain and the gate of transistor $T_5$ as shown in FIG. 2.

Of these transistors $T_1$ to $T_7$, transistors $T_1$ and $T_2$ at the input end side form a differential pair input part of amplifier $11_n$. Also, transistors $T_5$ and $T_6$ at the output end side form a drive part of amplifier $11_n$. Whereas the amount of heat generated by the differential pair input part is comparatively low, the amount of heat generated by the drive part is comparatively high.

Also as shown in FIGS. 1 and 2, photodetector 1 of the present embodiment is divided among the three substrates of a first substrate 100, a second substrate 200, and a third substrate 300. That is, the N photodiodes $PD_1$ to $PD_N$ are aligned one-dimensionally or two-dimensionally on first substrate 100. On second substrate 200 are positioned the differential pair input part of amplifier $11_n$, capacitor C, and switch SW of each of the N integrating circuits $10_1$ to $10_N$. On third substrate 300 are positioned the drive part and the other transistors $T_3$, $T_4$, and $T_7$ of amplifier $11_n$ of each of the N integrating circuits $10_1$ to $10_N$, as well as the N CDS circuits $20_1$ to $20_N$ and the N hold circuits $30_1$ to $30_N$.

Figure 3:
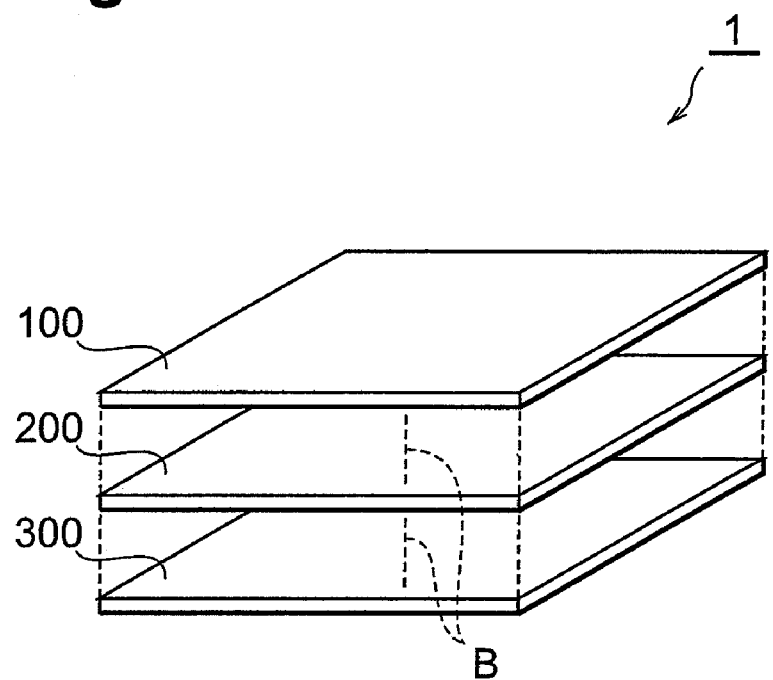
FIG. 3 is a perspective view showing the positional relationship of a first substrate 100, a second substrate 200, and a third substrate 300 of photodetector 1 of the embodiment.

FIG. 3 is a perspective view showing the positional relationship of first substrate 100, second substrate 200, and third substrate 300 of photodetector 1 of the present embodiment. In actuality, substrates 100 and 200 are electrically connected to each other and substrates 200 and 300 are electrically connected to each other through bump electrodes. As shown in FIG. 3, with photodetector 1 of the present embodiment, the respective substrates are mounted so as to overlap in the direction of incidence of light, and first substrate 100 and second substrate 200 are bump-connected to each other and second substrate 200 and third substrate 300 are bump-connected to each other.

Figure 4:
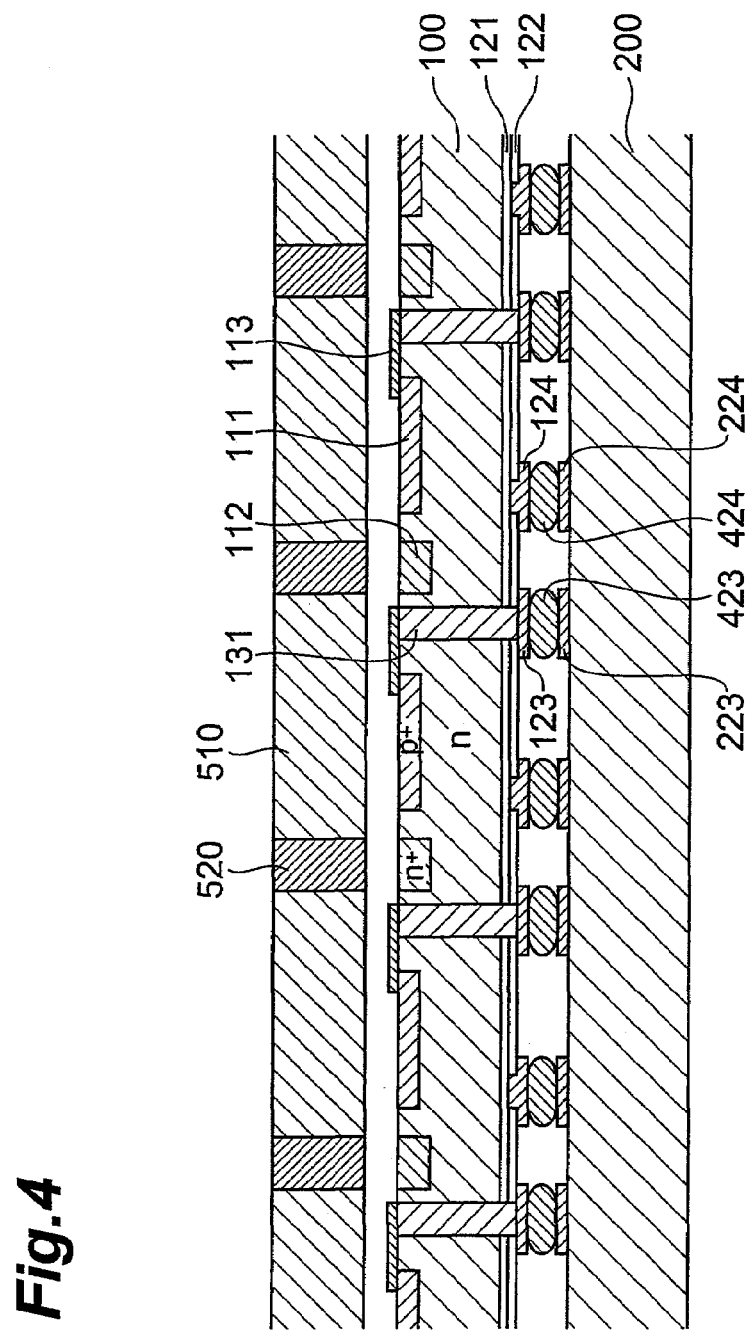
FIG. 4 is a diagram showing an example of a cross section of first substrate 100 and second substrate 200 of photodetector 1 of the embodiment.

When light is made incident on first substrate 100, charges of an amount, which is in accordance with the incident light amount, are output from each photodiode $PD_n$, and these charges are input from first substrate 100 via the bump connection into the input end of the corresponding integrating circuit $10_n$ on second substrate 200. A voltage, which is in accordance with the amount of charges generated at photodiode $PD_n$, is then output from integrating circuit $10_n$ that includes amplifier $11_n$, which is disposed across both second substrate 200 and substrate 300, and capacitor C and switch SW, which are disposed on second substrate 200. A voltage expressing the variation amount over a fixed time of the voltage output from integrating circuit $10_n$ is then output from CDS circuit $20_n$, disposed on third substrate 300, and the voltage output from CDS circuit $20_n$ is then held for a fixed period and then output by hold circuit $30_n$, disposed on third substrate 300 FIG. 4 is a diagram showing an example of a cross section of first substrate 100 and second substrate 200 of photodetector 1 of the present embodiment. Since in FIG. 4, a basic pattern is repeated in the left and right directions, the following description shall concern only a single basic pattern.

With first substrate 100, on a first surface (the upper side surface in FIG. 4) of an n-type semiconductor substrate are formed a p$^+$ region 111, which forms a pn junction with the n-type substrate and thereby makes up a photodiode PD, and an n$^+$ region 112, which serves as an isolation region. Also, with first substrate 100, on a second surface (the lower side surface in FIG. 4) of the n-type semiconductor substrate are formed an n$^+$-type impurity layer 121, which forms an ohmic connection with a metal electrode 124, an insulating protective layer 122, for protecting the surface, and metal electrode 124, which passes through protective layer 122 and is electrically connected with n$^+$-type impurity layer 121. Furthermore, first substrate 100 has a through hole 131, passing through between the first surface and the second surface, and a through electrode 131 is disposed in this through hole. A metal wiring layer 113, which electrically connects p$^+$ region 111 and through electrode 131, is formed on the first surface side of first substrate 100, and a metal electrode 123, which is electrically connected with through electrode 131, is formed on the second surface side.

With second substrate 200, a metal electrode 223, which is electrically connected to the input end of an integrating circuit $10_n$, and a metal electrode 224, which is electrically connected to a ground potential, are formed on a first surface (the upper side surface in FIG. 4) of a semiconductor substrate. Metal electrode 123 of first substrate 100 and metal electrode 223 of second substrate 200 are connected to each other by a bump 423, and metal electrode 124 of first substrate 100 and metal electrode 224 of second substrate 200 are connected to each other by a bump 424. The gap between first substrate 100 and second substrate is filled with a resin.

Also, on the first surface side of first substrate 100 are positioned a scintillator 510 and a shielding member 520. Scintillator 510 is disposed above p$^+$ region 111 of first substrate 100 and generates scintillation light upon incidence of X-rays or other energy rays. Shielding material 520 is disposed above n$^+$ region 112 of first substrate 100, blocks the transmission of X-rays and other energy rays, and fixes scintillator 510.

With the arrangement shown in FIG. 4, when X-rays or other energy rays are made incident into scintillator 510, scintillation light is generated by scintillator 510. When this scintillation light is then made incident on p$^+$ region 111 of first substrate 100, charges are generated at the pn junction part. These charges are input, via metal wiring layer 113, through electrode 131, metal electrode 123, bump 423, and then metal electrode 223 of second substrate 200, into the input end of integrating circuit $10_n$, which is formed on second substrate 200. If switch SW of integrating circuit $10_n$ is open, the charges input into the input end are accumulated in capacitor C. A voltage, which is in accordance with the amount of charges accumulated in capacitor C, is then output from the drive part of integrating circuit $10_n$, which is formed on third substrate 300.

Figure 5:
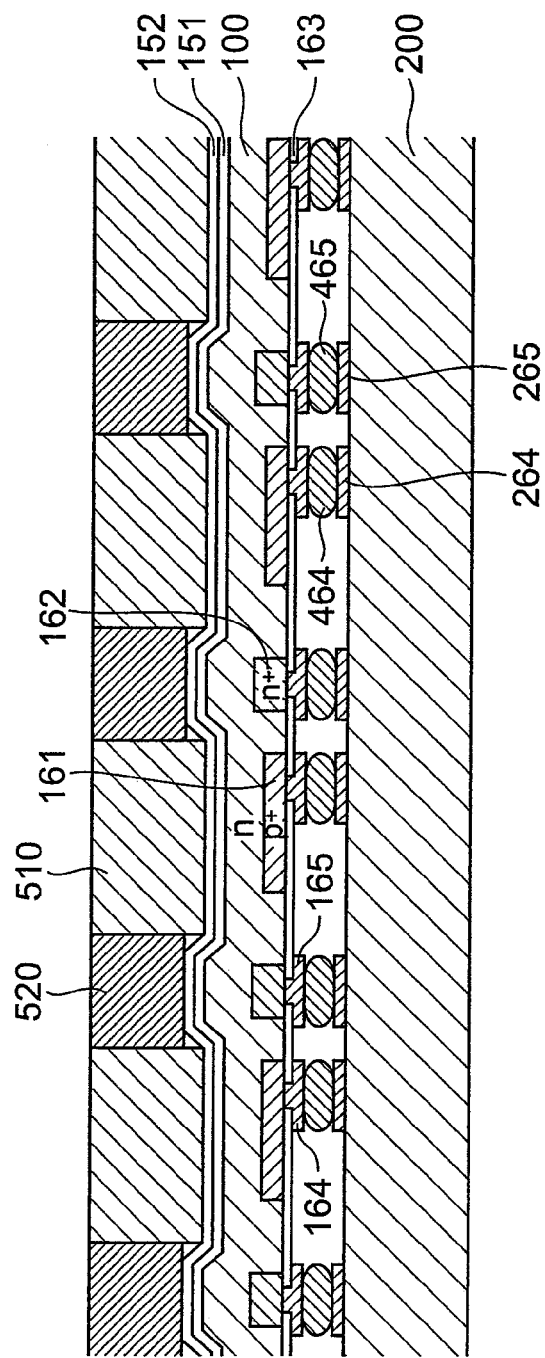
FIG. 5 is a diagram showing another example of a cross section of first substrate 100 and second substrate 200 of photodetector 1 of the embodiment.

FIG. 5 is a diagram showing another example of a cross section of first substrate 100 and second substrate 200 of photodetector 1 of the present embodiment. Since a basic pattern is repeated in the left and right directions in FIG. 5 as well, the following description shall concern only a single basic pattern.

With first substrate 100, on a first surface (the upper side surface in the FIG. 5) of an n-type semiconductor substrate are formed an n$^+$-type accumulation layer 151 for preventing charge recombination and an insulating protective layer 152 for protecting the surface. With first substrate 100, on a second surface (the lower side surface in the FIG. 5) of the n-type semiconductor substrate are formed a p$^+$ region 161, which forms a pn junction with the n-type substrate and thereby makes up a photodiode PD, and an n$^+$ region 162, which serves as an isolation region, and a protective layer 163 is formed above these regions. Also on the second surface of first substrate 100 are formed a metal electrode 164, which is electrically connected with p$^+$ region 161, and a metal electrode 165, which is electrically connected with n$^+$ region 162.

With second substrate 200, metal electrodes 264 and 265, which are electrically connected to the input end of an integrating circuit $10_n$, are formed on a first surface (the upper side surface in the FIG. 5) of a semiconductor substrate. Metal electrode 164 of first substrate 100 and metal electrode 264 of second substrate 200 are connected to each other by a bump 464, and metal electrode 165 of first substrate 100 and metal electrode 265 of second substrate 200 are connected to each other by a bump 465. The gap between first substrate 100 and second substrate is filled with a resin.

Also, on the first surface of first substrate 100 are positioned a scintillator 510 and a shielding member 520. Scintillator 510 is disposed above p$^+$ region 161 of first substrate 100 and generates scintillation light upon incidence of X-rays or other energy rays. Shielding material 520 is disposed above n$^+$ region 162 of first substrate 100, blocks the transmission of X-rays and other energy rays, and fixes scintillator 510. Also with first substrate 100, at the part at which p$^+$ region 161 is formed, the first surface side is made thin in thickness by chemical-mechanical polishing, anisotropic etching, etc.

With the arrangement shown in FIG. 5, when X-rays or other energy rays are made incident into scintillator 510, scintillation light is generated by scintillator 510. When this scintillation light is then transmitted through first substrate 100 and made incident on p$^+$ region 161, charges are generated at the pn junction part. These charges are input, via metal wiring layer 164, bump 464, and then metal electrode 264 of second substrate 200, into the input end of integrating circuit $10_n$, which is formed on second substrate 200. If switch SW of integrating circuit $10_n$ is open, the charges input into the input end are accumulated in capacitor C. A voltage, which is in accordance with the amount of charges accumulated in capacitor C, is then output from the drive part of integrating circuit $10_n$, which is formed on third substrate 300.

Thus with this embodiment's photodetector 1 of either of the arrangements shown in FIGS. 4 and 5, charges that are generated in each photodiode PD$_n$ on first substrate 100 are input into the input end of integrating circuit $10_n$ on second substrate 200, which is bump-connected to this first substrate 100, and accumulated in capacitor C. A voltage that is in accordance with the amount of charges in capacitor C is then output from the drive part of integrating circuit $10_n$ on third substrate 300.

The wiring on first substrate 100 can thus be lessened in amount or shortened to enable an increased number of pixels and high density to be realized readily on the first substrate. Also, since the charge transfer path from photodiode PD$_n$ on first substrate 100 to the differential pair input part of amplifier $11_n$ and capacitor C of integrating circuit $10_n$ on second substrate 200 can be shortened, the superposition of noise is restrained, and accurate photodetection is thereby enabled. Also, though the drive part of amplifier $11_n$ of each integrating circuit $10_n$ on third substrate 300 is high in heat generation amount, since it is disposed away from first substrate 100, on which each photodiode $PD_n$ is formed, temperature rise of each photodiode $PD_n$ on first substrate 100 is restrained and accurate photodetection is enabled from this point as well. This embodiment is also favorable in that optimal manufacturing processes can be employed for first substrate 100, on which a photodiode array is formed, and for second substrate 200 and third substrate 300, on which signal processing circuits, such as the integrating circuits, are formed.

Figure 6:
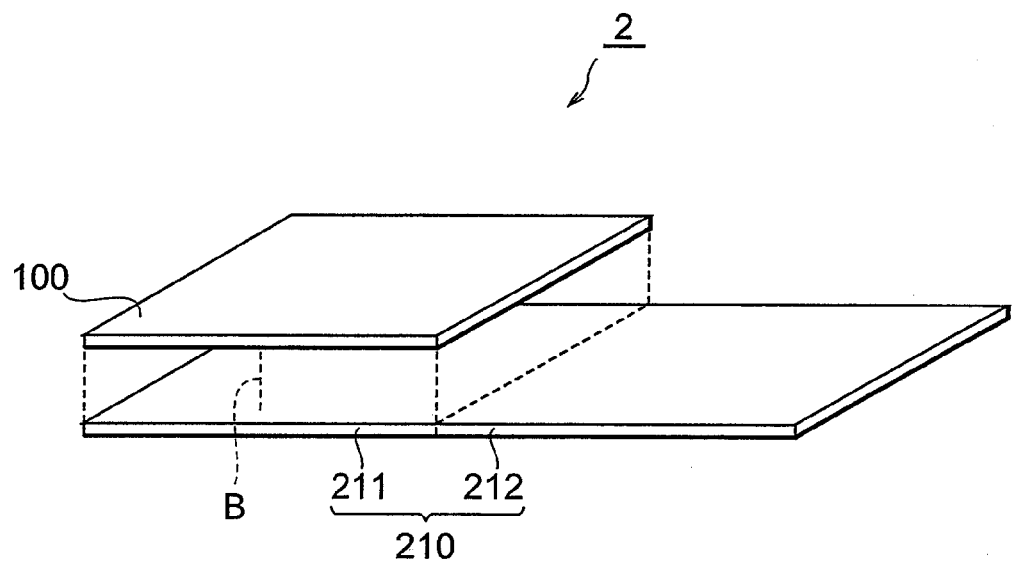
FIG. 6 is a perspective view showing the positional relationship of a first substrate 100 and a second substrate 210 of a photodetector 2 of another embodiment.

FIG. 6 is a perspective view showing the positional relationship of a first substrate 100 and a second substrate 210 of a photodetector 2 of another embodiment. First substrate 100 of this photodetector 2 is the same in arrangement as first substrate 100 of the above-described photodetector 1 and has N photodiodes $PD_1$ to $PD_n$ formed thereon. Meanwhile, second substrate 210 is substantially the same as an arrangement in which second substrate 200 and third substrate 300 of the above-described photodetector 1 are put together.

Second substrate 210 of this photodetector 2 includes a first region 211 and a second region 212. First region 211 of second substrate 210 is connected by a bump B to first substrate 100, thereby electrically connecting a photodiode $PD_n$ and the input end of an integrating circuit $10_n$ to each other. First region 211 of second substrate 210 is a region that overlaps with a region on first substrate 100 on which photodiodes $PD_1$ to $PD_N$ are disposed and, as with second substrate 200 of the above-described photodetector 1, has capacitor C and the differential pair input part of amplifier $11_n$ of integrating circuit $10_n$ disposed therein. Meanwhile, second region 212 of second substrate 210 is a region that does not overlap with the region on first substrate 100 on which photodiodes $PD_1$ to $PD_N$ are disposed and, as with third substrate 300 of the above-described photodetector 1, has the drive part of amplifier $11_n$ of integrating circuit $10_n$ disposed therein.

With this photodetector 2, charges that are generated in each photodiode $PD_n$ on first substrate 100 are input into the input end of integrating circuit $10_n$ in first region 211 of second substrate 210, which is bump-connected to this first substrate 100, and accumulated in capacitor C. A voltage that is in accordance with the amount of charges in capacitor C is then output from the drive part of integrating circuit $10_n$ in second region 212 of second substrate 210, which does not overlap with first substrate 100. The same effects as those exhibited by the above-described photodetector 1 can thus be exhibited.

This invention is not limited to the embodiments described above, and various modifications are possible. For example, the amplifier included in the integrating circuit is not limited to that of the arrangement shown in FIG. 2 and may be of another arrangement. Also, the respective cross-sectional structures of first substrate 100 and second substrate 200 are not restricted to those shown in each of FIGS. 4 and 5. Also another circuit (for example, an A/D conversion circuit, etc.,) may be disposed on third substrate 300 or in second region 212 of second substrate 210.

As described in detail above, with the present invention, the differential pair input parts of amplifiers and capacitors of integrating circuits are disposed on a second substrate (or in a first region of a second substrate), which is connected by bumps to a is first substrate. Meanwhile, the drive parts of the amplifier of the integrating circuits are disposed on a third substrate (or in a second region of the second substrate), which is not bump-connected to the first substrate. Thus with this invention's photodetector, increased number of pixels and high density can be realized while enabling accurate photodetection.

INDUSTRIAL APPLICABILITY

This invention can be used in a photodetector.

What is claimed is:

1. A photodetector comprising:
a plurality of photodiodes, each generating charges of an amount that is in accordance with the intensity of incident light; and
integrating circuits, each including an amplifier, having a differential pair input part at the input end side and a drive part at the output end side, and a capacitor and a switch, which are disposed between said input end and said output end of said amplifier, and, when said switch is opened, accumulating, in the capacitor, charges input into said input end from an above-mentioned photodiode and outputting, from said output end, a voltage that is in accordance with the amount of charges accumulated in said capacitor,
said plurality of photodiodes being disposed on a first substrate,
said capacitors and said differential pair input parts being disposed on a second substrate,
said drive parts being disposed on a third substrate, and
said photodiodes and said input ends of said integrating circuits being electrically connected to each other by said first substrate and said second substrate being bump-connected to each other.

2. The photodetector according to claim 1, wherein said second substrate and said third substrate are bump-connected to each other.

3. A photodetector comprising:
a plurality of photodiodes, each generating charges of an amount that is in accordance with the intensity of incident light; and
integrating circuits, each including an amplifier, having a differential pair input part at the input end side and a drive part at the output end side, and a capacitor and a switch, which are disposed between said input end and said output end of said amplifier, and, when said switch is opened, accumulating, in the capacitor, charges input into said input end from an above-mentioned photodiode and outputting, from said output end, a voltage that is in accordance with the amount of charges accumulated in said capacitor,
said plurality of photodiodes being disposed on a first substrate,
said capacitors, said differential pair input parts, and said drive parts being disposed on a second substrate,
said photodiodes and said input ends of the integrating circuits being electrically connected to each other by said first substrate and said second substrate being bump-connected to each other,
said capacitors and said differential pair input parts being disposed in a first region on said second substrate that overlaps with a region on said first substrate in which said plurality of photodiodes are disposed, and
said drive parts are disposed in a second region on said second substrate that does not overlap with the region on said first substrate in which said plurality of photodiodes are disposed.

* * * * *